(12) United States Patent
Ghantasala et al.

(10) Patent No.: US 11,209,478 B2
(45) Date of Patent: Dec. 28, 2021

(54) PULSE SYSTEM VERIFICATION

(71) Applicant: APPLIED MATERIALS, INC., Santa Clara, CA (US)

(72) Inventors: Sathyendra Ghantasala, Fremont, CA (US); Hyun-Ho Doh, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 445 days.

(21) Appl. No.: 15/944,688

(22) Filed: Apr. 3, 2018

(65) Prior Publication Data
US 2019/0302174 A1   Oct. 3, 2019

(51) Int. Cl.
*G01R 31/28*    (2006.01)
*G01R 19/00*    (2006.01)
(Continued)

(52) U.S. Cl.
CPC ..... *G01R 31/2822* (2013.01); *G01R 19/0061* (2013.01); *H01L 21/3065* (2013.01); *H04B 17/102* (2015.01)

(58) Field of Classification Search
CPC ............ G01R 31/2822; G01R 31/2824; G01R 19/0061; H01L 21/3065; H04B 17/102;
(Continued)

(56) References Cited

U.S. PATENT DOCUMENTS 6,861,844 B1   3/2005   Verdeyen et al.
7,787,543 B2   8/2010   Yamaguchi
(Continued)

FOREIGN PATENT DOCUMENTS

KR    10-0757347 B1    9/2007
TW    201810356 A      3/2018
WO    WO 2013-157031 A1   10/2013

OTHER PUBLICATIONS

Taiwan Search Report for Application No. 108111447, dated Feb. 8, 2020.

(Continued)

*Primary Examiner* — Huy Q Phan
*Assistant Examiner* — Dustin R Dickinson
(74) *Attorney, Agent, or Firm* — Moser Taboada

(57) ABSTRACT

A system for verifying the operation of RF generators and resulting pulse waveforms in semiconductor processes includes a process chamber, a profile sensor, an optical sensor and a controller. A process implemented by the controller of the system for verifying the operation of RF generators and resulting pulse waveforms in semiconductor processes includes generating a pulse profile of a pulse shape of an RF generator under test, selecting a stored, representative profile of an RF generator known to be operating correctly to compare to the profile generated for the RF generator for a same pulse mode, defining a quantitative metric/control limit to identify similarities and/or differences between pulses of same pulse modes between the generated profile of the RF generator and the stored profile, comparing the generated profile and the selected stored profile, and determining if the RF generator under test is operating properly based on the comparison.

16 Claims, 6 Drawing Sheets

(51) Int. Cl.
*H04B 17/10* (2015.01)
*H01L 21/3065* (2006.01)

(58) Field of Classification Search
CPC .......... H01J 37/32917; H01J 37/32926; H01J 37/32935; H01J 37/32963; H01J 37/32981; H01J 37/3299; H01J 37/32128
See application file for complete search history.

(56) References Cited

U.S. PATENT DOCUMENTS

| | | | |
|---|---|---|---|
| 2009/0132189 A1 | 5/2009 | Shannon et al. | |
| 2009/0245302 A1 | 10/2009 | Baird et al. | |
| 2010/0033194 A1* | 2/2010 | Daniels | H01J 37/32935 324/639 |
| 2010/0033195 A1* | 2/2010 | Booth | H01J 37/32935 324/663 |
| 2010/0176855 A1 | 7/2010 | Huffman et al. | |
| 2012/0318456 A1* | 12/2012 | Brouk | H01J 37/32174 156/345.28 |
| 2014/0062303 A1* | 3/2014 | Hoffman | H05H 1/46 315/111.21 |
| 2015/0241272 A1 | 8/2015 | Lian et al. | |
| 2015/0382442 A1 | 12/2015 | Mueller et al. | |
| 2016/0126068 A1* | 5/2016 | Lee | H01J 37/32091 156/345.25 |
| 2016/0131587 A1* | 5/2016 | Meloni | G01N 21/68 315/111.21 |
| 2016/0268100 A1 | 9/2016 | Valcore, Jr. et al. | |
| 2016/0268108 A1* | 9/2016 | Daniels | H01J 37/32935 |
| 2018/0005805 A1* | 1/2018 | Voronin | H01J 37/32935 |
| 2018/0115299 A1 | 4/2018 | Nagami et al. | |

OTHER PUBLICATIONS

International Search Report for PCT/US2019/024532, dated Feb. 28, 2020.

* cited by examiner

PULSE SYSTEM VERIFICATION

FIELD

Embodiments of the present principles generally relate to semiconductor processes and more specifically to methods, apparatus, and systems for verifying the operation of pulse systems and resulting pulse waveforms in semiconductor processes.

BACKGROUND

The pervasiveness of pulsed plasmas in etch processes, coupled with innovative and complex pulsing schemes being developed on etch tools drive the need for a pulse verification/diagnostic system. More specifically, the inventors believe that a need exists to verify the accurate operation of pulse systems, which can include RF generators, to desired pulsed power set-points and ensure matching of pulse characteristics (waveform, frequency, duty cycle, etc.) across tools. Currently, there are no systems or sensors available for verifying the accurate operation of pulse systems to desired pulsed power set-points and for ensuring the matching of pulse characteristics (waveform, frequency, duty cycle, etc.) across tools.

SUMMARY

Embodiments of methods, apparatus, and systems for verifying the operation of pulse systems and resulting pulse waveforms in semiconductor processes are disclosed herein.

In some embodiments in accordance with the present principles, a method for verifying a pulsing system includes generating a pulse profile of pulses of at least one pulse generator of the pulsing system using measurements of a profile sensor for at least one pulse mode, selecting a representative pulse profile of pulses of a pulse generator known to be operating properly including pulses of at least one same pulse mode as the generated pulse profile, defining a quantitative metric with which to identify similarities and/or differences between pulses of the at least one same pulse mode for the generated pulse profile and the selected, representative pulse profile, comparing respective pulses of the generated pulse profile and the selected, representative pulse profile in light of the defined quantitative metric, and determining if the at least one pulse generator of the pulsing system is operating properly based on the comparison of the respective pulses of the generated pulse profile and the selected, representative pulse profile.

In some embodiments, the method can further include generating a pulse profile of a plasma process in a process chamber in which plasma is ignited including different pulse modes of the at least one pulse generator of the pulsing system using measurements of an optical sensor, selecting a representative pulse profile of a plasma process implemented using a pulsing system known to be operating properly including the same pulse modes as the generated pulse profile of the plasma process, comparing respective pulses of the generated pulse profile of the plasma process and the selected, representative pulse profile of the plasma process in light of the defined quantitative metric and determining if the pulsing system is operating properly based on the comparison of the respective pulses of the generated pulse profile of the plasma process and the selected, representative profile of the plasma process implemented using the pulsing system known to be operating properly.

In some embodiments the method can further include de-convoluting pulses of at least one of the generated pulse profile of the plasma process or the pulses of the selected, representative pulse profile prior to the comparison of the respective pulses of the generated pulse profile of the plasma process and the selected, representative pulse profile of the plasma process.

In some embodiments, an apparatus for verifying a pulsing system, includes a profile sensor to take measurements of at least one pulse generator and a controller including a memory to store at least program instructions and data, and a processor. In such embodiments, the processor, when executing the program instructions, configures the apparatus to generate a pulse profile of pulses of at least one pulse generator of the pulsing system using measurements of outputs of the at least one pulse generator from the profile sensor for at least one pulse mode, select a representative pulse profile of pulses of a pulse generator known to be operating properly including pulses of at least one same pulse mode as the generated pulse profile, define a quantitative metric with which to identify similarities and/or differences between pulses of the at least one same pulse mode for the generated pulse profile and the selected, representative pulse profile, compare respective pulses of the generated pulse profile and the selected, representative pulse profile in light of the defined quantitative metric, and determine if the at least one pulse generator of the pulsing system is operating properly based on the comparison of the respective pulses of the generated pulse profile and the selected, representative pulse profile.

In some embodiments, the apparatus can further include an optical sensor and the apparatus can further be configured to generate a pulse profile of a plasma process in a process chamber in which plasma is ignited including different pulse modes of the at least one pulse generator of the pulsing system using measurements of images of the plasma process taken by the optical sensor, select a representative pulse profile of a plasma process implemented using a pulsing system known to be operating properly including the same pulse modes as the generated pulse profile of the plasma process, compare respective pulses of the generated pulse profile of the plasma process and the selected, representative pulse profile of the plasma process in light of the defined quantitative metric, and determine if the pulsing system is operating properly based on the comparison of the respective pulses of the generated pulse profile of the plasma process and the selected, representative profile of the plasma process implemented using the pulsing system known to be operating properly.

In some embodiments the apparatus can further be configured to de-convolute at least one of the pulses of the generated pulse profile of the plasma process or the pulses of the selected, representative pulse profile of the plasma process prior to the comparison of the respective pulses of the generated pulse profile of the plasma process and the selected, representative pulse profile of the plasma process.

In some embodiments, a system for verifying a pulsing system includes a pulsing system including at least one pulse generator to generate pulses, a process chamber to implement semiconductor processes, a profile sensor to take measurements of outputs of the at least one pulse generator, and a controller including a memory to store at least program instructions and data, and a processor. The processor, when executing the program instructions, configures the controller to, generate a pulse profile of pulses of the at least one pulse generator of the pulsing system using measurements of outputs of the at least one pulse generator from the profile sensor for at least one pulse mode, select a representative pulse profile of pulses of a pulse generator known to be operating properly including pulses of at least one same pulse mode as the generated pulse profile, define a quantitative metric with which to identify similarities and/or differences between pulses of the at least one same pulse mode for the generated pulse profile and the selected, representative pulse profile, compare respective pulses of the generated pulse profile and the selected, representative pulse profile in light of the defined quantitative metric, and determine if the at least one pulse generator of the pulsing system is operating properly based on the comparison of the respective pulses of the generated pulse profile and the selected, representative pulse profile.

In some embodiments, the system can further include an optical sensor and the controller can be further configured to generate a pulse profile of a plasma process in the process chamber in which plasma is ignited including different pulse modes of the at least one pulse generator of the pulsing system using measurements of images of the plasma process taken by the optical sensor, select a representative pulse profile of a plasma process implemented using a pulsing system known to be operating properly including the same pulse modes as the generated pulse profile of the plasma process, compare respective pulses of the generated pulse profile of the plasma process and the selected, representative pulse profile of the plasma process in light of the defined quantitative metric, and determine if the pulsing system is operating properly based on the comparison of the respective pulses of the generated pulse profile of the plasma process and the selected, representative profile of the plasma process implemented using the pulsing system known to be operating properly.

Other and further embodiments of the present principles are described below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the present principles and are therefore not to be considered limiting of scope, for the present principles may admit to other equally effective embodiments.

Figure 1:
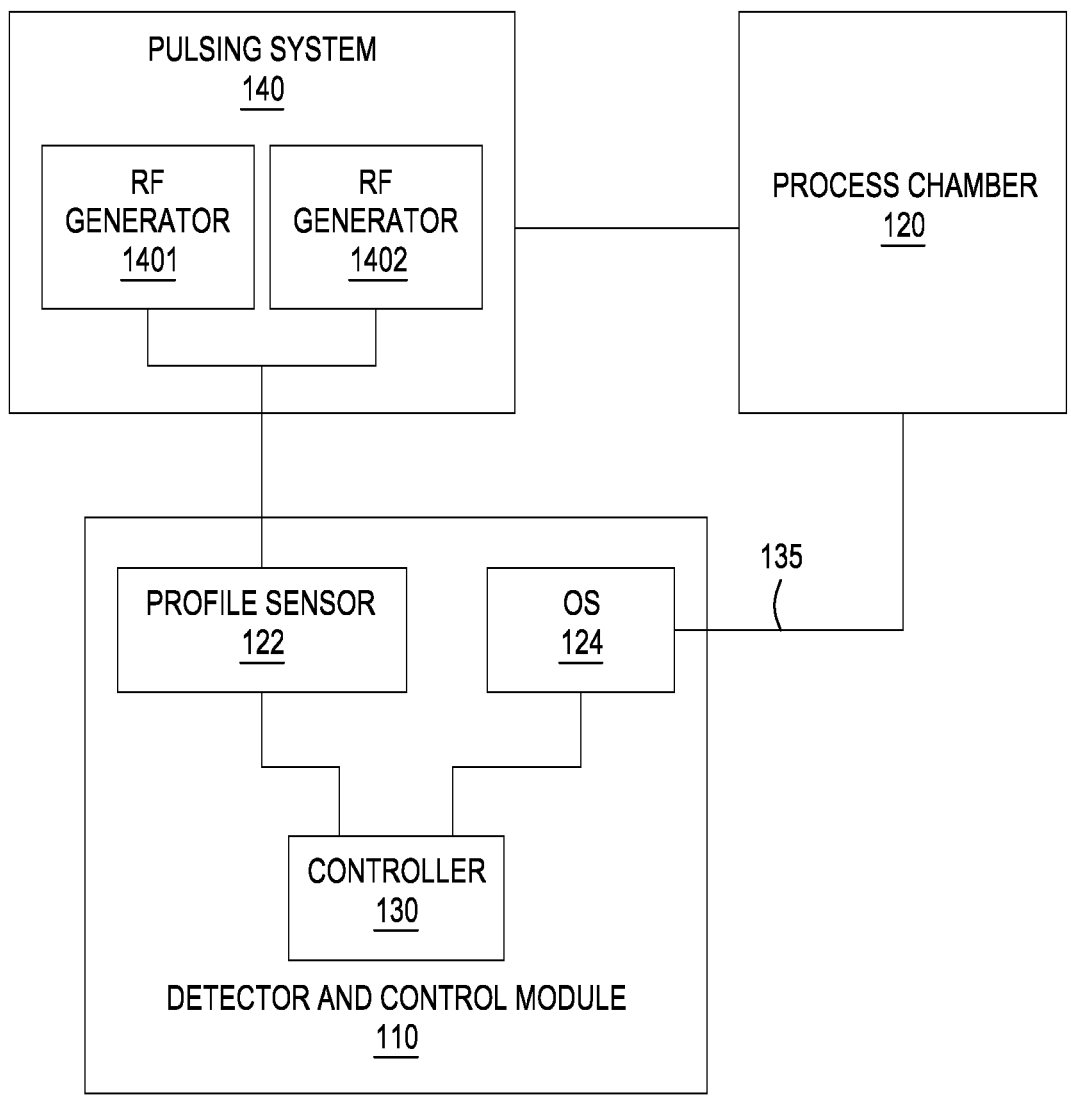
FIG. 1 depicts a high level block diagram of a system for verifying the operation of RF generators and resulting pulse waveforms in semiconductor processes in accordance with an embodiment of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

In the following detailed description, numerous specific details are set forth in order to provide a thorough understanding of exemplary embodiments or other examples described herein. However, these embodiments and examples may be practiced without the specific details. Further, the embodiments disclosed are for exemplary purposes only and other embodiments may be employed in lieu of, or in combination with, the embodiments disclosed. For example, although a pulse verification system in accordance with an embodiment of the present principles is described herein with respect to an etch chamber, a pulse verification system in accordance with the present principles can be implemented on any tools other than etch systems, such as tools that utilize pulse generators, such as RF generators, and have the capability to strike and sustain a plasma. Therefore, the spirit and scope of the appended claims should not be limited to the description of the embodiments contained herein.

A method, apparatus and system in accordance with the present principles provide pulse system verification to ensure operational accuracy of generators and resulting pulse waveforms in various pulse modes.

FIG. 1 depicts a high level block diagram of a system for verifying the operation of pulse systems and resulting pulse waveforms in semiconductor processes in accordance with an embodiment of the present principles. The verification system 100 of FIG. 1 illustratively comprises a detector and control module 110, a process chamber 120 (illustratively an etch chamber with pulsed plasma), and a pulsing system 140, illustratively in the embodiment of FIG. 1, two RF generators, 140₁ and 140₂. In the embodiment of the verification system 100 of FIG. 1, the detector and control module 110 illustratively comprises a controller 130, a profile sensor 122 and an optical sensor (OS) 124. In the embodiment of the verification system 100 of FIG. 1, images of a pulsed plasma process occurring in the process chamber 120 are relayed to the optical sensor 124 via a fiber optic cable 135. In some embodiments in accordance with the present principles, the profile sensor 122 can include at least one of a Bird pulse profile sensor or a power sensor and the optical sensor 124 can include at least one of a Bird Pulse Profile sensor (i.e., for peak detection) or an optical sensor with high frequency data collection.

Although in the embodiment of FIG. 1, the detector and control module 110 illustratively comprises a single profile sensor 122, in alternate embodiments in accordance with the present principles, the detector and control module 110 can include more than one profile sensor 122, and can include a respective profile sensor 122 for each of the RF generators 140, for measuring the outputs of the RF generators 140 to be used in evaluating the performance of the RF generators 140 as described in further detail below.

In one operational embodiment, the output of at least one of the RF generators 140 is communicated to the detector and control module 110 and monitored by the profile sensor 122. The profile sensor 122 monitors, for example, at least one or more of a pulsed power, a pulsed frequency and a duty cycle of the output of the RF generator 140. Alternatively or in addition, in some embodiments the RF generator 140 can be scanned at multiple power levels over the range of allowable pulse frequency (PF) and duty cycle (DC) settings. The profile sensor 122 monitors the output of the RF generator 140 and communicates the measurements of the outputs of the RF generator 140 to the controller 130.

Figure 2:
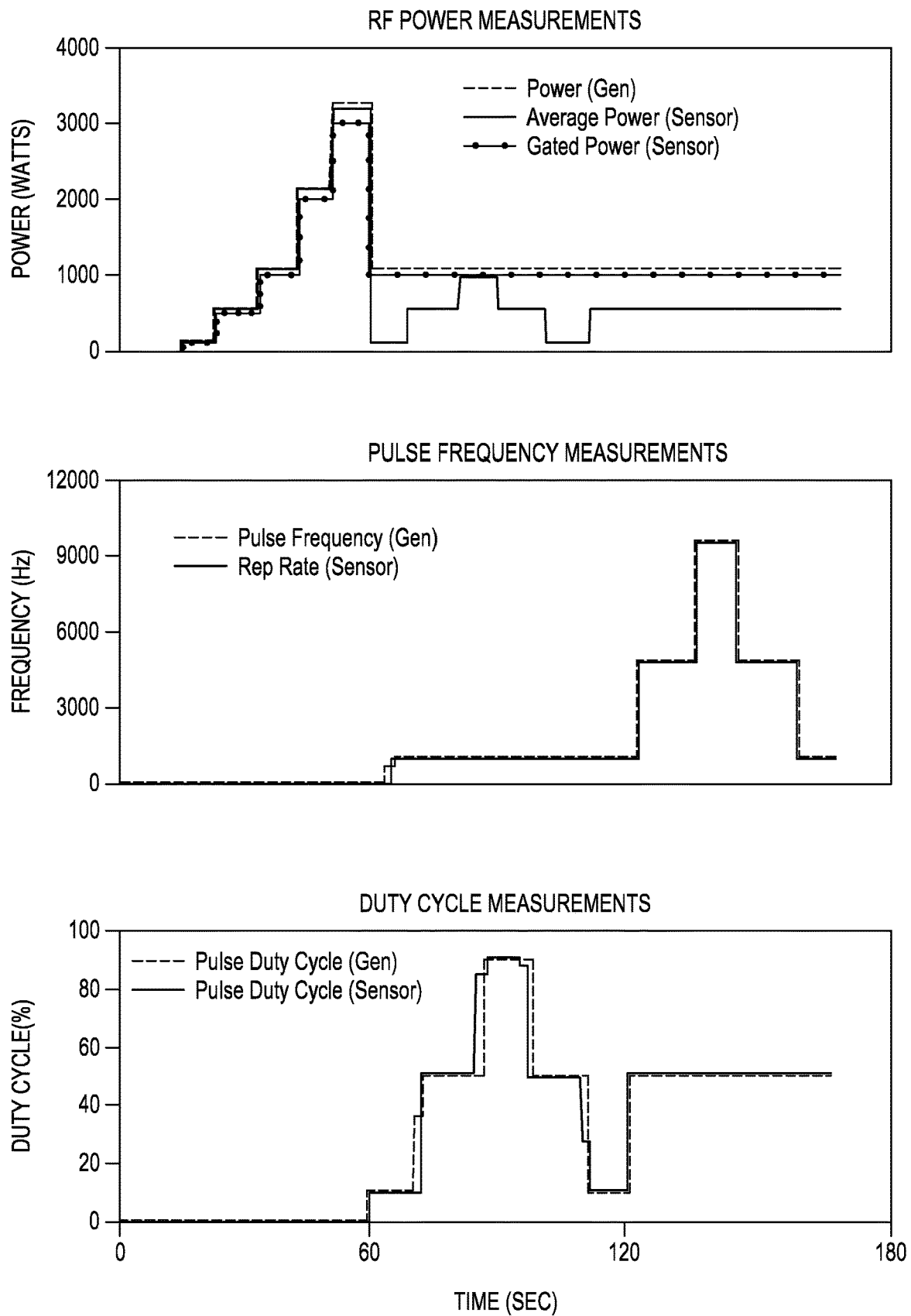
FIG. 2 depicts respective profile plots of pulse power measurements, pulse frequency measurements and duty cycle measurements of an RF generator in accordance with an embodiment of the present principles.

At the controller 130, a profile is generated from the measurements from the profile sensor 122 of the outputs of the RF generator 140. For example, FIG. 2 depicts respective profile plots of pulse power measurements, pulse frequency measurements and duty cycle measurements of an RF generator between source generator and power sensor in accordance with an embodiment of the present principles. As depicted in FIG. 2, the profile sensor 122 tracks pulse frequency and duty cycle measurements accurately while also measuring average power in a pulse period and during pulse-on time. That is, as depicted in FIG. 2, the generator power setpoint during pulse-on time (Power(Gen), the power measured by the profile sensor 122 only during pulse-on time (Gated Power) and the Average power measured by the profile sensor 122 within a pulse period (Power averaged between pulse on and pulse off times) are all accurately measured by the profile sensor 122.

In some embodiments in accordance with the present principles, a profile of an output of an RF generator is generated as described above before the RF generator is put into production. Alternatively or in addition, a profile of an RF generator is generated as described above while the RF generator is in a production environment, for example, when the RF generator is being used to create pulsed plasmas in etch processes.

In some embodiments in accordance with the present principles, a profile of an RF generator that is known to be operating properly is generated as described above to be used as a reference profile for later comparison with other RF generators for purposes of verifying the operation of the other RF generators. In addition, as described above, an RF generator can be scanned at multiple power levels over the range of allowable pulse frequency (PF) and duty cycle (DC) settings. A respective profile of the output of RF generator at the multiple power levels and over the range of allowable pulse frequency and duty cycle settings can be generated as described above.

In accordance with embodiments of the present principles, the generated profiles of RF generators known to be operating properly can be used to compare with generated profiles of test or unknown RF generators to determine if the test or unknown RF generators are operating properly. For example, profiles of RF generators that are known to be operating properly can be stored in a memory. The stored profiles can be used to compare the profiles of the generators known to be operating properly to profiles of RF generators (e.g., RF generators 140) generated by the verification system 100, to determine if the RF generators 140 are operating properly.

In some embodiments, for comparing profiles (i.e., waveforms) of RF generators, a quantitative metric/control limit is defined to identify similarities and/or differences between shapes of same pulse modes. That is, in some embodiments a threshold can be defined to establish how similar or how different respective pulses of the generated profile for the RF generator and the stored profiles can be to determine if an RF generator (i.e., under test) is operating properly. For example, in one embodiment a quantitative metric can define that a pulse of a generated profile should be within a percentage amount of a stored profile to be considered acceptable. For example, a quantitative metric can establish that an amplitude of a generated pulse profile should be within a percentage (e.g., 5%) of a stored profile to be considered similar to the stored profile. In some embodiments in accordance with the present principles, a threshold of the similarities and/or the differences of the profiles is defined to be used in determining if the pulse shape of an RF generator is within a tolerance of a pulse shape of a stored profile of an RF generator known to be operating properly. Such threshold can be defined for one, some or each of the pulse modes and characteristics of the RF generators. In some embodiments, some other quantitative metrics of generated pulses can include the slope of a pulse (ramp-up rate/ramp-down rate), a peak value of a pulse, a pulse width of a pulse, and the like.

In some embodiments in accordance with the present principles, the comparison of the profiles can be done manually, such as by presenting the respective stored profile of a properly operating RF generator and the generated profile of the RF generator (i.e., to be tested) on a display, such as a display of the controller 480, and visually determining if the profiles are similar within a tolerance.

Alternatively or in addition, the comparison of the profiles as described above can be performed by the controller 130 of the verification system 100 of FIG. 1. For example, as described above the profile sensor 122 can monitor a pulsed frequency and a duty cycle of the output of the RF generator 140 at multiple power levels over the range of allowable pulse frequency (PF) and duty cycle (DC) settings. The profile sensor 122 communicates the measurements of the outputs of the RF generator 140 to the controller 130. At the controller 130, a profile is generated from the measurements from the profile sensor 122 of the outputs of the RF generator 140. The controller 130 can then access stored profiles of RF generators known to be operating properly to compare the profile generated for the RF generator 140 to a stored profile, as described above, to determine if the RF generator 140 is operating properly. In some embodiments, the controller 130 can perform feature extraction on the pulse shapes of the profiles for same pulse modes to enable the comparison of the features of the pulses of a generated profile for an RF generator to the features of the pulses for a stored profile for same pulse modes. For example, in some embodiments in accordance with the present principles, feature extraction can include the use of dynamic model coefficients, principle component analysis and the like.

Figure 3:
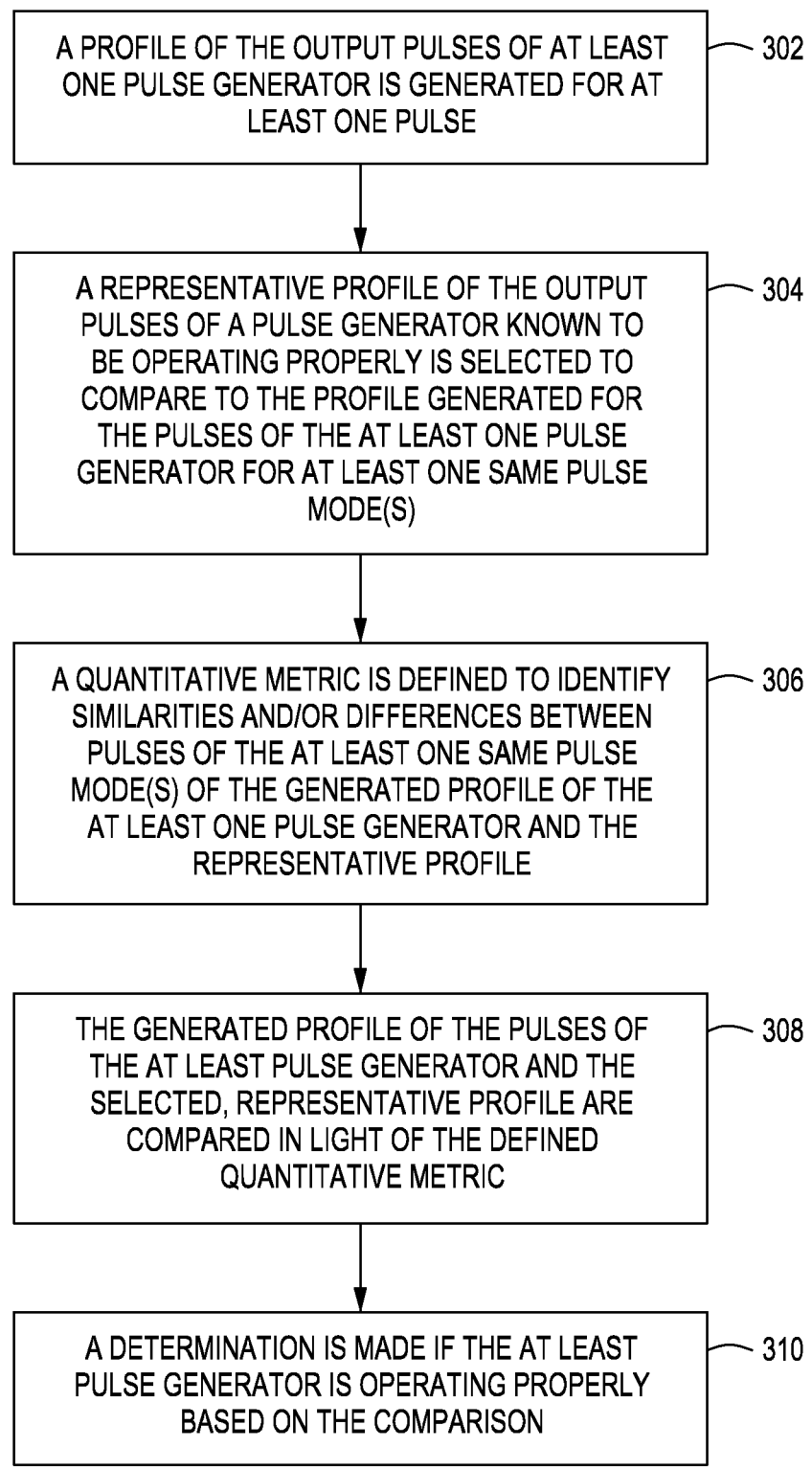
FIG. 3 depicts a flow diagram of a method for verifying the operation of an RF generator in accordance with an embodiment of the present principles.

FIG. 3 depicts a flow diagram of a method 300 for verifying the operation of an RF generator in accordance with an embodiment of the present principles. The method 300 can begin at 302 during which a profile of the output pulses of at least one pulse generator, such as at least one of the RF generators 140, is generated for at least one pulse mode. As described above, in some embodiments the profile sensor 122 monitors at least one or more of a pulsed power, a pulsed frequency and a duty cycle of the output of at least one of the RF generators 140. In some embodiments the RF generators 140 can be scanned at multiple power levels over the range of allowable pulse frequency (PF) and duty cycle (DC) settings. The profile sensor 122 communicates the measurements of the outputs of at least one of the RF generators 140 to the controller 130 at which, a profile of the output pulses of at least one of the of the RF generators 140 is generated from the measurements from the profile sensor 122 for at least one pulse mode. The method 300 can proceed to 304.

At 304, a representative profile of the output pulses of an RF generator known to be operating properly is selected to compare to the profile generated for the pulses of at least one of the RF generators 140, at 302 above, for a same pulse mode/modes. As described above, in some embodiments the profile of RF generators known to be operating properly can be stored in a memory accessible to the controller 130. The controller 130 can select a stored profile to compare to the profile generated for the at least one RF generator 140 for at least one same pulse mode(s). The method 300 can proceed to 306.

At 306, a quantitative metric/control limit is defined to identify similarities and/or differences between pulses of at least one same pulse mode(s) between the generated profile of the RF generator 140 and the representative profile. As described above, in some embodiments, a threshold of the similarities and/or the differences of the profiles is defined to be used in determining if the pulse shape of the pulses of the at least one RF generator 140 (i.e., under test) is within a tolerance of a pulse shape of a representative profile of an RF generator known to be operating properly for at least one same pulse mode(s). The method 300 can proceed to 308.

At 308, the generated profile of the pulses of at least one of the RF generators 140 and the pulses of the selected, representative profile are compared in light of the defined quantitative metric/control limit. That is, in some embodiments, the generated profile of at least one of the RF generators 140 and a selected, representative profile are compared based on a defined quantitative metric/control limit. As described above, in some embodiments, feature extraction can be performed on the pulses of the profiles of the at least one RF generator to be compared to pulses of at least one same pulse mode(s) of the stored profiles. Alternatively or in addition, feature extraction can also be performed on the pulses of the stored profiles if necessary for making a comparison. The method 300 can proceed to 310.

At 310, a determination is made if the at least one RF generator 140 is operating properly based on the comparison. In some embodiments, an RF generator can be determined to be operating properly if it is determined that a quantitative metric is satisfied between at least one pulse of a generated pulse profile and a respective pulse of a stored profile for at least one pulse mode. Alternatively, or in addition, an RF generator can be determined to be operating properly if it is determined that a quantitative metric is satisfied between a specific number of pulses of a generated pulse profile and respective pulses of a stored profile for at least one pulse mode. As described above in one example in which a quantitative metric establishes that an amplitude of a generated pulse profile should be within a percentage (e.g., 5%) of a stored profile, if it is determined that the amplitude of the generated pulse profile is within the percentage of the stored profile as a result of a comparison (i.e., the comparison in 308), a determination can be made that the at least one RF generator 140 is operating properly. The method 300 can then be exited.

Referring back to the verification system 100 of FIG. 1, during operation of the process chamber 120, the optical sensor 124 can be used to verify implementation of multi-generator pulse modes on the process chamber 120. More specifically, during operation of the process chamber 120, for example during an etch process, plasma is ignited (e.g., struck) and different pulse modes involving multiple generators (e.g., RF generators 140) are run. The optical sensor 124 collects measurements (e.g., images) of the process occurring in the process chamber 120 and communicates the measurements to the controller 130. In some embodiments, the optical sensor 124 can be located within the chamber in a position enabling the optical sensor 124 to sense the plasma and the different pulse modes. For example, in one embodiment, the detector and control module 110 is located within the process chamber 120 such that the optical sensor 124 is able to sense the plasma and the different pulse modes. Alternatively or in addition, a fiber optic cable can be placed in the process chamber and located such that the fiber optic cable can sense the plasma and the different pulse modes. For example, in one embodiment the fiber optic cable can be located at a location proximate a viewing window in the process chamber 120. The images picked up by the fiber optic cable can then be communicated to the optical sensor 124 and the measurements of the optical sensor 124 can be communicated to the controller 130. At the controller 130, a profile is generated from the measurements from the optical sensor 124 of the pulses occurring in the plasma process and the different pulse modes.

In accordance with embodiments of the present principles, the generated profiles of the plasma at the different pulse modes are compared with stored profiles of the plasma at the different pulse modes generated from process chambers having pulsing systems known to be operating properly to verify accurate implementation of the various pulse (Sync/A-Sync) modes and to identify any process chambers exhibiting behavior outside nominal variations. That is, generated profiles can be analyzed to verify accurate implementation of different pulse (Sync/A-Sync) modes.

In some embodiments, profiles of the plasma struck at different pulse modes generated from process chambers having pulsing systems known to be operating properly can be stored in a memory. The stored profiles can be compared to profiles generated at the same pulse modes for pulses generated by a pulsing system of a new/test process chambers as described above, to determine if the pulsing systems of the new/test process chambers are operating properly.

In some embodiments, in comparing profiles (i.e., waveforms) of plasma struck at different pulse modes, the profiles are de-convoluted to identify individual pulses and signal peaks in a signal collected by the optical sensor 124. If necessary, the stored profiles can also be de-convoluted to identify individual pulses. In some embodiments, to de-convolute the profiles, the controller 130 analyzes the respective profiles via pattern recognition algorithms, such as correlation analysis, Procrustes (shape comparison) image processing algorithms, principle component analysis and the like.

Figure 4:
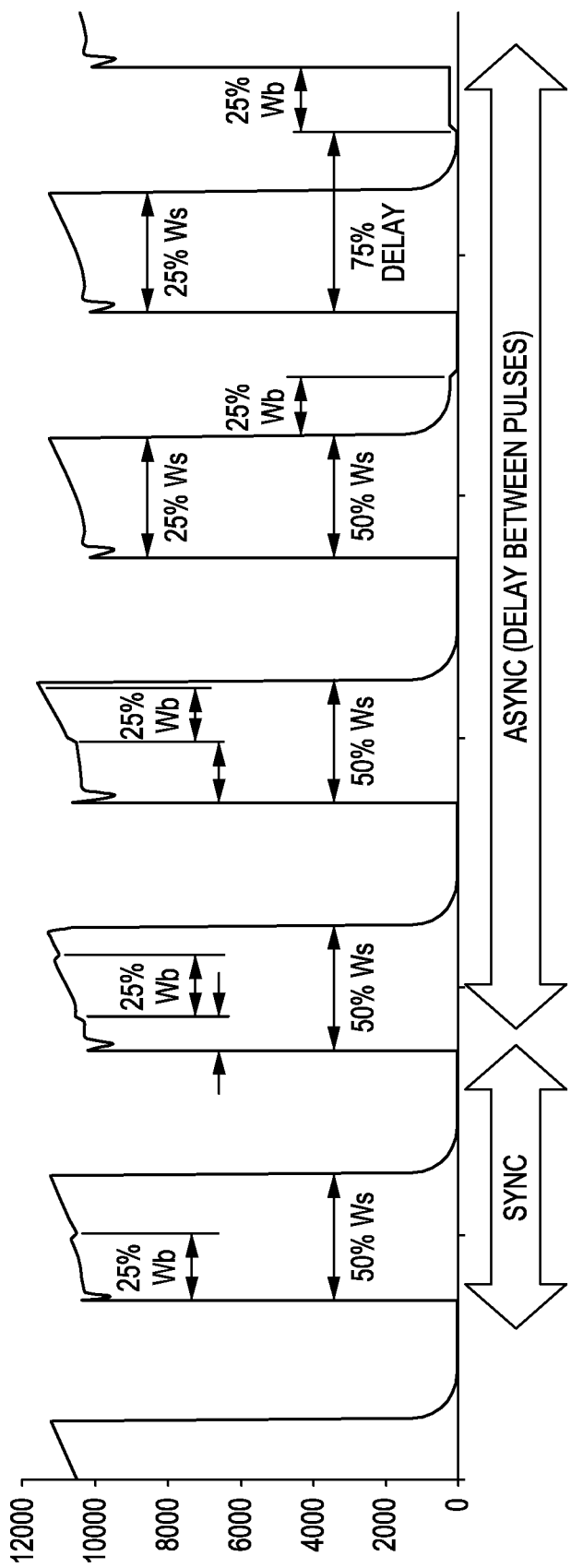
FIG. 4 depicts a graphical representation of optical emission profiles generated from various pulse modes of O2 plasma in accordance with an embodiment of the present principles.

FIG. 4 depicts a graphical depiction of optical sensor profiles generated as described above from various pulse modes of O2 plasma. In the optical sensor profiles of FIG. 4, a source (1 kW/50% DC) and Bias (1.2 kW/25% DC) are pulsed at 1 kHz frequency, initially in synchronous mode and then with increasing delays in successive runs. As seen from the plot of FIG. 4, profiles show clear signatures that distinguish between modes, which can be analyzed and recognized via, for example, a pattern recognition algorithm. As depicted in FIG. 4, at 12.5% delay, a hump seen in waveform lasts for approximately 25% of the period relating to bias on-time. The successive plots of FIG. 4 depict different time offsets between generators used to generate the pulses. That is, FIG. 4, depicts representative optical emission profiles generated during a plasma process having different pulse modes. The first plot represents synchronized pulsing of source and bias generators (turn on and off the pulse at the same time), and the following plots depict asynchronous behavior where the bias generator is offset from the source generator.

Alternatively or in addition, for a pulse mode with delays, the delays between the generators can be quantified by referring to the timing of a pulse source. The known delays can then be used to de-convolute the profiles to, for example, identify individual pulses.

In some embodiments in accordance with the present principles, the comparison of the profiles can be done manually, such as by presenting the respective stored profile of a process chambers having known, properly operating pulsing systems and the generated profile of a process chamber (i.e., to be tested) on a display and visually determining if the profiles are similar within a tolerance. Alternatively or in addition, the comparison of the profiles as described above can be performed by the controller 130 of the verification system 100 of FIG. 1. For example, as described above the optical sensor 124 collects measurements of a process in the process chamber 120 in which different pulse modes involving multiple generators are run. The optical sensor 124 communicates the measurements to the controller 130. At the controller 130, a profile is generated from the measurements from the optical sensor 124 of the process in the process chamber 120 in which different pulse modes involving multiple generators are run. The controller 130 can then access stored profiles of process chambers having pulsing systems known to be operating properly to compare the profile generated for the process chamber 120 to a stored profile, as described above, to determine if the pulsing system of the process chamber 120 is operating properly.

A quantitative metric/control limit can be defined to identify similarities and/or differences between shapes of same pulse modes for performing the comparison of the pulse profiles. That is, as described above with respect to comparing generated profiles for RF generators and stored profiles, in some embodiments a threshold can be defined to establish how similar or how different respective pulses of the generated profile for the plasma process and the stored profiles of a plasma processes can be to determine if a pulsing system of a plasma process (i.e., under test) is operating properly. In some embodiments in accordance with the present principles, a threshold of the similarities and/or the differences of the profiles is defined to be used in determining if the pulse shapes of a pulsing system of a plasma process are within a tolerance of a pulse shape of a stored profile of plasma process having a pulsing system known to be operating properly. Such threshold can be defined for one, some or each of the pulse modes and characteristics of the pulsing system of the plasma process.

Figure 5:
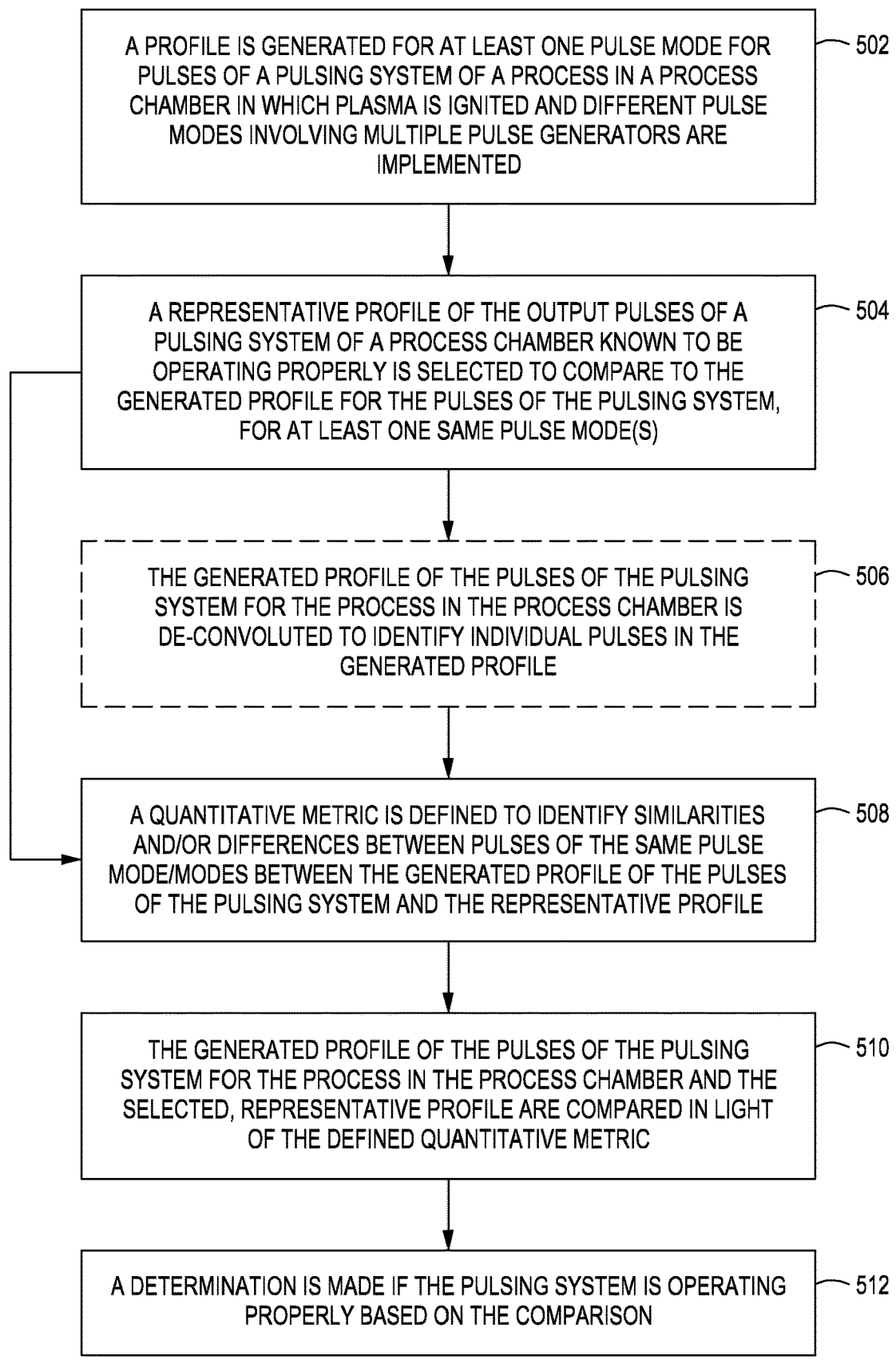
FIG. 5 depicts a flow diagram of a method for verifying the operation of a process chamber in accordance with an embodiment of the present principles.

FIG. 5 depicts a flow diagram of a method 500 for verifying the operation of a pulsing system of a process chamber in accordance with an embodiment of the present principles. The method 500 can begin at 502 during which a profile is generated for pulses of a pulsing system of a process in the process chamber 120 in which plasma is ignited (e.g., struck) and different pulse modes involving multiple generators are implemented. As described above, in some embodiments the optical sensor 124 collects images of a process in the process chamber 120 in which different pulse modes involving multiple generators are implemented. The optical sensor 124 communicates the measurements to the controller 130. At the controller 130, a profile is generated from the measurements from the optical sensor 124 of the process in the process chamber 120 for at least one pulse mode(s). The method 500 can proceed to 504.

At 504, a representative profile is selected to compare to the profile generated for the pulses of the pulsing system of the process chamber 120 at 502 above. As described above, in some embodiments a profile of the pulses of a pulsing system of a process chamber having a pulsing system known to be operating properly can be stored in a memory accessible by the controller 130. The controller 130 can select a stored profile to compare to the profile generated for the pulses of the pulsing system of the process chamber 120 for at least one same pulse mode(s). The method 500 can optionally proceed to 506 or can proceed to 508.

At 506, the generated profile of the pulses of the pulsing system for the process in the process chamber 120, in which different pulse modes involving multiple generators are implemented, is de-convoluted to identify the individual pulses for use in comparing the profiles. As described above, in some embodiments the generated profile can be de-convoluted using a pattern recognition algorithm. The method 500 can proceed to 508.

At 508, a quantitative metric/control limit is defined to identify similarities and/or differences between pulses of same pulse modes between the generated profile of the pulsing system of the process chamber 120 and the stored profile. A threshold of the similarities and/or the differences of the profiles is defined to be used in determining if a pulse shape of pulses of a generated profile of the pulses of a pulsing system for a process of the process chamber 120 is within a tolerance of a pulse shape of respective pulses of a stored profile of pulses of a pulsing system of a process chamber known having a pulsing system known to be operating properly for same pulse modes. The method 500 can proceed to 510.

At 510, the generated profile and the stored profile are compared in light of the defined quantitative metric/control limit. That is, in some embodiments, the generated profile and the stored profile are compared based on the defined quantitative metric/control limit. The method 500 can proceed to 512. As described above, in some embodiments, feature extraction can be performed on the pulses of the profile of the pulsing system of the process chamber 120 to be compared to respective pulses of the same pulse modes of the stored profiles. Alternatively or in addition, feature extraction can also be performed on the pulses of the stored profiles. The method 500 can proceed to 512.

At 512, a determination is made if the pulsing system for the process chamber 120 is operating properly based on the comparison. In some embodiments, the pulsing system for the process chamber 120 can be determined to be operating properly if it is established that a quantitative metric is satisfied between at least one pulse of a generated profile and a respective pulse of a stored profile based on a comparison (i.e., the comparison of 510). Alternatively, or in addition, the pulsing system for the process chamber 120 can be determined to be operating properly if it is established that a quantitative metric is satisfied between a specific number of pulses of a generated profile and respective pulses of a stored profile for at least one pulse mode based on the comparison. The method 500 can then be exited.

Figure 6:
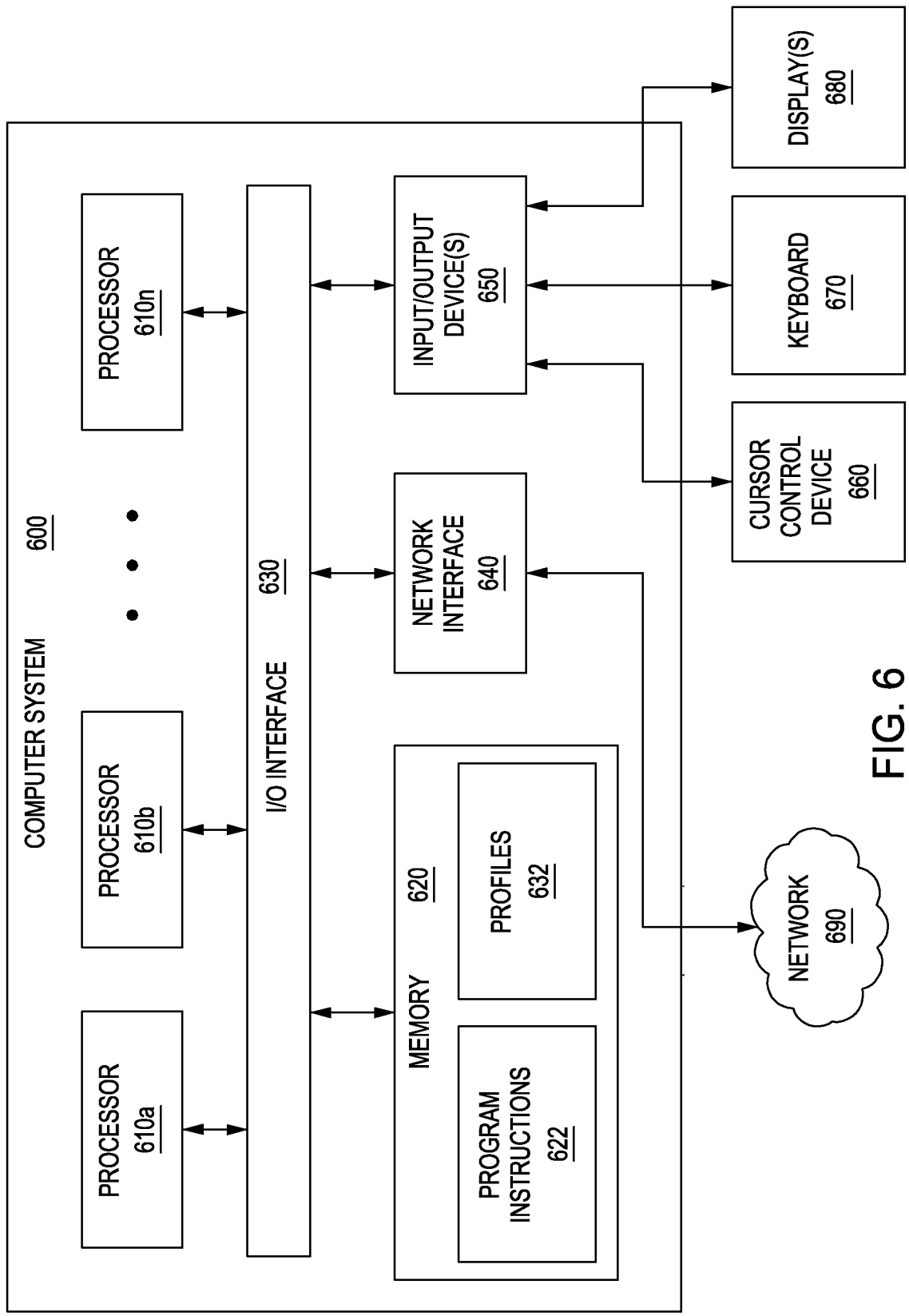
FIG. 6 depicts a high level block diagram of a controller suitable for use in the system of FIG. 1 in accordance with an embodiment of the present principles.

FIG. 6 depicts a high level block diagram of a controller 130 suitable for use in the verification system of FIG. 1 in accordance with an embodiment of the present principles. The controller 130 can be used to implement any other system, device, element, functionality or method of the above-described embodiments. In the illustrated embodiments, the controller 130 can be configured to implement method 300 and method 500 as processor-executable executable program instructions 622 (e.g., program instructions executable by processor(s) 610).

In the illustrated embodiment, the controller 130 includes one or more processors 610a-610n coupled to a system memory 620 via an input/output (I/O) interface 630. The controller 130 further includes a network interface 640 coupled to I/O interface 630, and one or more input/output devices 660, such as a cursor control device keyboard 670, and display(s) 680. In some embodiments, the cursor control device keyboard 670 can be a touchscreen input device.

In different embodiments, the controller 130 can be any of various types of devices, including, but not limited to, personal computer systems, mainframe computer systems, handheld computers, workstations, network computers, application servers, storage devices, a peripheral devices such as a switch, modem, router, or in general any type of computing or electronic device.

In various embodiments, the controller 130 can be a uniprocessor system including one processor 610, or a multiprocessor system including several processors 610 (e.g., two, four, eight, or another suitable number). Processors 610 can be any suitable processor capable of executing instructions. For example, in various embodiments processors 610 can be general-purpose or embedded processors implementing any of a variety of instruction set architectures (ISAs). In multiprocessor systems, each of processors 410 can commonly, but not necessarily, implement the same ISA.

System memory 620 may be configured to store waveform profiles as described above, program instructions 622 and/or profiles 632 accessible by processor 610. In various embodiments, system memory 620 can be implemented using any suitable memory technology, such as static random access memory (SRAM), synchronous dynamic RAM (SDRAM), nonvolatile/Flash-type memory, or any other type of memory. In the illustrated embodiment, program instructions and data implementing any of the elements of the embodiments described above can be stored within system memory 620. In other embodiments, program instructions and/or data can be received, sent or stored upon different types of computer-accessible media or on similar media separate from system memory 620 or the controller 130.

In one embodiment, I/O interface 630 can be configured to coordinate I/O traffic between processor 610, system memory 620, and any peripheral devices in the device, including network interface 640 or other peripheral interfaces, such as input/output devices 650. In some embodiments, I/O interface 630 can perform any necessary protocol, timing or other data transformations to convert data signals from one component (e.g., system memory 620) into a format suitable for use by another component (e.g., processor 610). In some embodiments, the function of I/O interface 630 can be split into two or more separate components, such as a north bridge and a south bridge, for example. Also, in some embodiments some or all of the functionality of I/O interface 630, such as an interface to system memory 620, can be incorporated directly into processor 610.

Network interface 640 can be configured to allow data to be exchanged between the controller 130 and other devices attached to a network (e.g., network 690), such as one or more external systems. In various embodiments, network 690 can include one or more networks including but not limited to Local Area Networks (LANs) (e.g., an Ethernet or corporate network), Wide Area Networks (WANs) (e.g., the Internet), wireless data networks, cellular networks, Wi-Fi, some other electronic data network, or some combination thereof. In various embodiments, network interface 640 can support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 650 can, in some embodiments, include one or more display devices, keyboards, keypads, cameras, touchpads, touchscreens, scanning devices, voice or optical recognition devices, or any other devices suitable for entering or accessing data. Multiple input/output devices 650 can be present in the controller 130. In some embodiments, similar input/output devices can be separate from the controller 130.

In some embodiments, the illustrated computer system can implement any of the methods described above, such as the methods illustrated by the flowchart of FIG. 3 and FIG. 5. In other embodiments, different elements and data can be included.

The controller 130 of FIG. 6 is merely illustrative and is not intended to limit the scope of embodiments. In particular, the computer system and devices can include any combination of hardware or software that can perform the indicated functions of various embodiments, including computers, network devices, Internet appliances, smartphones, tablets, PDAs, wireless phones, pagers, and the like. The controller 130 can also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

While various items are illustrated as being stored in memory or on storage while being used, these items or portions of these items may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from the controller 130 can be transmitted to the controller 130 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium or via a communication medium. In general, a computer-accessible medium may include a storage medium or memory medium such as magnetic or optical media, e.g., disk or DVD/CD-ROM, volatile or non-volatile media such as RAM (e.g., SDRAM, DDR, RDRAM, SRAM, and the like), ROM, and the like.

The methods described herein can be implemented in software, hardware, or a combination thereof, in different embodiments. In addition, the order of methods can be changed, and various elements may be added, reordered, combined, omitted or otherwise modified. All examples described herein are presented in a non-limiting manner. Various modifications and changes can be made having benefit of the present disclosure. Realizations in accordance with embodiments have been described in the context of particular embodiments. These embodiments are meant to be illustrative and not limiting. Many variations, modifications, additions, and improvements are possible. Accordingly, plural instances can be provided for components described herein as a single instance. Boundaries between various components, operations and data stores are somewhat arbitrary, and particular operations are illustrated in the context of specific illustrative configurations. Other allocations of functionality are envisioned and can fall within the scope of claims that follow. Finally, structures and functionality presented as discrete components in the example configurations can be implemented as a combined structure or component.

While the foregoing is directed to embodiments of the present principles, other and further embodiments may be devised without departing from the basic scope thereof.

The invention claimed is:

1. A method for verifying a pulsing system, comprising:
generating a pulse profile of pre-production pulses of at least one pulse generator of the pulsing system using measurements of a profile sensor for at least one pulse mode;
generating a pulse profile of optical pulses of a plasma process in a process chamber in which plasma is ignited by the at least one pulse generator of the pulsing system using measurements of an optical sensor for at least one pulse mode;
selecting a representative pulse profile of pulses of a pulse generator known to be operating properly including pulses of at least one same pulse mode as the generated pre-production pulse profile and plasma process pulse profile;
defining a quantitative metric with which to identify similarities and/or differences between pulses of the at least one same pulse mode for at least one of the generated pre-production pulse profile and plasma process pulse profile and the selected, representative pulse profile;
comparing respective pulses of at least one of the generated pre-production pulse profile and plasma process pulse profile and the selected, representative pulse profile in light of the defined quantitative metric; and
determining if the at least one pulse generator of the pulsing system is operating properly based on the comparison of the respective pulses of the at least one of the generated pre-production pulse profile and plasma process pulse profile and the selected, representative pulse profile.

2. The method of claim 1, wherein the pre-production pulse profile and the plasma process pulse profile are generated by a controller receiving the measurements from the profile sensor and the optical sensor, respectively, of outputs of the at least one pulse generator.

3. The method of claim 2, wherein the controller selects the representative pulse profile of the pulse generator known to be operating properly from a storage device accessible by the controller.

4. The method of claim 1, wherein a respective pulse profile is generated for one or more of a pulsed power, a pulsed frequency and a duty cycle of the at least one pulse generator.

5. The method of claim 1, wherein a respective pulse profile is generated for each of a number of multiple power levels over a range of at least one of available pulse frequency settings or duty cycle settings of the at least one pulse generator.

6. The method of claim 1, wherein the representative pulse profile of the pulse generator known to be operating properly is generated using measurements taken by at least one of the profile sensor and the optical sensor of an output of the pulse generator known to be operating properly.

7. The method of claim 1, wherein the pulse profile of pulses of the at least one pulse generator of the pulsing system are generated before the at least one pulse generator is used in production.

8. The method of claim 1, wherein the pulse profile of pulses of the at least one pulse generator of the pulsing system are generated during operation of the at least one pulse generator in a production environment.

9. The method of claim 1, further comprising:
de-convoluting optical pulses of at least one of the generated pulse profile of the optical pulses of the plasma process or the optical pulses of the selected, representative pulse profile prior to the comparison of the respective optical pulses of the generated pulse profile of the optical pulses of the plasma process and the selected, representative pulse profile of the optical pulses of the plasma process.

10. The method of claim 1 wherein the pulse profile of the optical pulses of the plasma process is generated by a controller receiving the measurements from the optical sensor of images of the plasma process.

11. An apparatus for verifying a pulsing system, comprising:
a profile sensor to take measurements of pre-production pulses of at least one pulse generator;
an optical sensor to take measurements of optical pulses of a plasma process in a process chamber in which plasma is ignited by the at least one pulse generator of the pulsing system; and
a controller comprising a memory to store at least program instructions and data, and a processor, when executing the program instructions, to configure the apparatus to:
generate a pulse profile of the pre-production pulses of at least one pulse generator of the pulsing system using the measurements of outputs of the at least one pulse generator from the profile sensor for at least one pulse mode;
generate a pulse profile of optical pulses of the plasma process using the measurements of the optical sensor for at least one pulse mode;
select a representative pulse profile of pulses of a pulse generator known to be operating properly including pulses of at least one same pulse mode as the generated pre-production pulse profile and plasma process pulse profile;
define a quantitative metric with which to identify similarities and/or differences between pulses of the at least one same pulse mode for at least one of the generated pre-production pulse profile and plasma process pulse profile and the selected, representative pulse profile;
compare respective pulses of at least one of the generated pre-production pulse profile and plasma process pulse profile and the selected, representative pulse profile in light of the defined quantitative metric; and
determine if the at least one pulse generator of the pulsing system is operating properly based on the comparison of the respective pulses of the at least one of the generated pre-production pulse profile and plasma process pulse profile and the selected, representative pulse profile.

12. The apparatus of claim 11, wherein representative pulse profiles of pulse generators known to be operating properly are stored in the memory of the apparatus.

13. The apparatus of claim 11, wherein the controller generates a respective pulse profile for one or more of a pulsed power, a pulsed frequency and a duty cycle of the at least one pulse generator.

14. The apparatus of claim 11, wherein the controller generates a respective pulse profile for each of a number of multiple power levels over a range of at least one of available pulse frequency settings or duty cycle settings of the at least one pulse generator.

15. The apparatus of claim 11, wherein the apparatus is further configured to:
de-convolute at least one of the pulses of the generated pulse profile of the optical pulses of the plasma process or the pulses of the selected, representative pulse profile of the optical pulses of the plasma process prior to the comparison of the respective pulses of the generated pulse profile of the optical pulses of the plasma process and the selected, representative pulse profile of the optical pulses of the plasma process.

16. A system for verifying a pulsing system, comprising:
a pulsing system including at least one pulse generator to generate pulses;
a process chamber to implement semiconductor processes;
a profile sensor to take measurements of pre-production pulses of at least one pulse generator;
an optical sensor to take measurements of optical pulses of a plasma process in a process chamber in which plasma is ignited by the at least one pulse generator of the pulsing system; and
a controller comprising a memory to store at least program instructions and data, and a processor, when executing the program instructions, to configure the controller to:
generate a pulse profile of pre-production pulses of the at least one pulse generator of the pulsing system using measurements of outputs of the at least one pulse generator from the profile sensor for at least one pulse mode;
generate a pulse profile of optical pulses of the plasma process using the measurements of the optical sensor for at least one pulse mode;
select a representative pulse profile of pulses of a pulse generator known to be operating properly including pulses of at least one same pulse mode as the generated pre-production pulse profile and plasma process pulse profile;
define a quantitative metric with which to identify similarities and/or differences between pulses of the at least one same pulse mode for at least one of the generated pre-production pulse profile and plasma process pulse profile and the selected, representative pulse profile;
compare respective pulses of at least one of the generated pre-production pulse profile and plasma process pulse profile and the selected, representative pulse profile in light of the defined quantitative metric; and
determine if the at least one pulse generator of the pulsing system is operating properly based on the comparison of the respective pulses of the at least one of the generated pre-production pulse profile and plasma process pulse profile and the selected, representative pulse profile.

* * * * *